(12) United States Patent
Parker et al.

(10) Patent No.: US 7,504,589 B2
(45) Date of Patent: Mar. 17, 2009

(54) METHOD AND APPARATUS FOR MANUFACTURING AND PROBING PRINTED CIRCUIT BOARD TEST ACCESS POINT STRUCTURES

(75) Inventors: Kenneth P. Parker, Fort Collins, CO (US); Chris R. Jacobsen, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 506 days.

(21) Appl. No.: 10/972,829

(22) Filed: Oct. 25, 2004

(65) Prior Publication Data

US 2006/0097737 A1 May 11, 2006

(51) Int. Cl.
*H05K 1/00* (2006.01)
(52) U.S. Cl. ..................................... 174/250
(58) Field of Classification Search ................ 361/788, 361/785; 439/74; 174/250
See application file for complete search history.

(56) References Cited

U.S. PATENT DOCUMENTS

| | | | | |
|---|---|---|---|---|
| 5,416,274 A | * | 5/1995 | Ushiyama et al. ........... 174/250 |
| 6,686,758 B1 | * | 2/2004 | Farnworth et al. .......... 324/765 |
| 6,917,525 B2 | * | 7/2005 | Mok et al. ................... 361/767 |
| 7,190,157 B2 | * | 3/2007 | Parker ...................... 324/158.1 |
| 2004/0150388 A1 | * | 8/2004 | Cheng et al. ............. 324/158.1 |
| 2004/0163252 A1 | * | 8/2004 | Khandros et al. ............. 29/884 |
| 2005/0061540 A1 | * | 3/2005 | Parker et al. ................ 174/250 |
| 2006/0097737 A1 | * | 5/2006 | Parker et al. ................ 324/754 |
| 2006/0103397 A1 | * | 5/2006 | Parker et al. ................ 324/754 |

* cited by examiner

*Primary Examiner*—Dean A. Reichard
*Assistant Examiner*—Abiy Getachew

(57) ABSTRACT

A test access point structure for accessing test points of a printed circuit board and method of fabrication thereof is presented. Each test access point structure is conductively connected to a trace at a test access point and above an exposed surface of the printed circuit board to be accessible for probing by a fixture probe. The test access point structure may be designed and manufactured to permit deformation of the test access point structure upon initial probing of the test access point structure with a fixture probe to ensure electrical contact between the fixture probe and the test access point structure.

8 Claims, 13 Drawing Sheets

METHOD AND APPARATUS FOR MANUFACTURING AND PROBING PRINTED CIRCUIT BOARD TEST ACCESS POINT STRUCTURES

BACKGROUND OF THE INVENTION

Printed circuit assemblies (PCA's) are typically tested after manufacture to verify the continuity of traces between pads and vias on the board and to verify that components loaded on the PCA perform within specifications. Such printed circuit assembly testing is generally performed with automated in-circuit testers or ICT's and requires complex tester resources. The tester hardware must generally be capable of probing conductive pads, vias and traces on the board under test.

In-circuit testers (ICT) have traditionally used "bed-of-nails" (BON) access to gain electrical connectivity to circuit wiring (traces, nets, pads) for control and observation capability needed for testing. This necessitates having access points within the layout of circuit nets that can be targets for ICT probes. Test access points are usually circular targets with 28 to 35 mil diameter that are connected to traces on the printed circuit board. In some cases these targets are deliberately added test pads, and in other cases the targets are "via" pads surrounding vias already provided in the printed circuit.

Lower diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Yet another industry trend is to use higher and higher speed logic families. One Megahertz (MHz) designs became ten MHz designs, then 100 MHz designs, and are now reaching the Gigahertz domain. The increases in logic speed necessitates industry attention to board layout rules for higher-speed interconnects. The goal of these rules is to create a controlled impedance pathway that minimizes noise, crosstalk and signal reflections.

The preferred way of transmitting high-speed data is through differential transmission signals. FIG. 1 illustrates the important layout parameters for a classic pair of differential transmission signal traces 102a, 102b on a portion of a printed circuit board 100. As illustrated, the printed circuit board 100 is formed as a plurality of layers. In the illustrative embodiment, the printed circuit board 100 includes a ground plane 104 layered over a substrate 105, a dielectric 103 layered over the ground plane 104, traces 102a, 102b layered over the dielectric 103, and a solder mask 106 layered over the traces 102a, 102b and exposed surfaces of the dielectric 103. In such a layout, there are a number of critical parameters that affect the impedance of the signal path. These parameters include trace width 110, trace separation 111, trace thickness 112, and dielectric constants of the solder mask and board material. These parameters influence the inductance, capacitance, and resistance (skin effect and DC) of the traces which combine to determine the transmission impedance. It is desired to control this value across the entire run of each trace 102a, 102b.

In higher speed designs it is also important to control the symmetry of the traces. Ideally, both paths 102a, 102b would be identical in length, as shown in FIG. 2A. However, routing signals on a crowded printed circuit board necessitates curves and bends in the path, which makes matching lengths and symmetries more difficult. In some cases, series components (such as series terminations or DC blocking capacitors) must be included in the path, and these have dimensions that differ from the layout parameters. FIG. 2B, for example, illustrates DC blocking capacitors 114a, 114b on the differential signal traces 102a, 102b. Signals may have to traverse connectors, which add to the difficulties.

Additional difficulties arise when testing is considered. Testing requires tester access to circuit traces at particular probe targets. Layout rules typically require test targets to be at least 50 mils apart and may require the diameter of the test point targets to greatly exceed the width of the traces. FIG. 2C illustrates test targets 115a, 115b symmetrically positioned 50 mils apart on the differential signal traces 102a, 102b. FIG. 2D illustrates test targets 115a, 115b arranged asymmetrically, but at least 50 mils apart, on the differential signal traces 102a, 102b. FIG. 2E illustrates test targets 115a, 115b arranged asymmetrically from the DC blocking capacitors 114a, 114b but at least 50 mils apart on the differential signal traces 102a, 102b, and FIG. 2F illustrates the test targets 115a, 115b implemented on the capacitors 114a, 114b themselves, requiring asymmetrical positioning of the capacitors on the differential signal traces 102a, 102b.

The positioning of test targets 102a, 102b can be problematic. In many cases the need to keep a minimum separation between targets (typically 50 mils, minimum) is in direct conflict with controlled impedance layout rules. These conflicts lead to either a compromise in controlled impedance integrity, or a forced reduction in target placement with a resulting reduction in testability. As signal speeds continue to rise and board densities increase, this problem will only get worse.

SUMMARY OF THE INVENTION

The present invention solves the conflict problems faced by traditional techniques for test access point placement on printed circuit boards by minimizing the perturbations of traces in the x- and y-dimensions and taking advantage of the z-dimension. In particular, the invention utilizes trace thickness to implement test access points, thereby allowing test access point placement almost anywhere along the trace. This in turn allows the ability to design printed circuit boards with test access point placement according to the positions of fixture probes of a given test fixture, rather than vice versa as in the prior art.

In one embodiment solder beads may be conductively connected to the top surfaces of traces where test access points are desired. In this embodiment, after the traces are printed or otherwise deposited on the printed circuit board, a solder mask having holes where test access points are desired may be deposited over the exposed surfaces of the traces. A solder stencil with a hole larger than the solder mask hole may be layered over the solder mask hole, exposing test access points along the traces. The solder stencil and solder mask may then be covered with solder paste, filling any holes in the stencil and mask. The solder paste may be made up of solder and flux. The solder stencil is removed, leaving islands of solder paste in selected places on the board. The solder paste may then be heated to burn off the flux, causing the solder to melt and retract and form solder beads that project above the walls of their respective solder mask holes. The dimensions of the solder mask and stencil mask holes determine the final shape of the solder beads. Accordingly, test access point structures may be implemented directly along the trace, yet have a large enough diameter to be probed and still meet board layout requirements.

The test access point structures may be probed by fixture probes during testing of the printed circuit board. The test access point structures may be deformed by the fixture probes or other devices to disturb any potential surface oxides or contaminants and ensure better electrical contact with fixture probes during test.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

This invention relates to U.S. patent application Ser. No. 10/670,649 entitled Printed Circuit Board Test Access Point Structures And Methods For Making The Same filed Sep. 24, 2003 by Kenneth P. Parker, Ronald J. Peiffer and Glen E. Leinbach and assigned to Agilent Technologies, Inc., which teaches the basic concepts of bead probes or test access point structures on a printed circuit board and is incorporated herein by reference.

Turning now in detail to the invention, on a trace defined in an x-, y-, z-coordinate system where the x-dimension represents the trace width, the y-dimension represents the trace length, and the z-dimension represents the trace thickness, it will be recognized by those skilled in the art that present techniques for test access point placement on a printed circuit board utilize only the x- and y-dimensions. The present invention takes a different approach by taking advantage of the z-dimension, that is, the trace thickness. In this regard, the test access point structure of the invention is a localized "high point" on a printed circuit board trace that does not significantly perturb the impedance of the trace and that can be targeted with a probe. Throughout this specification, test access point structure and bead probe structure are used interchangeably.

Figure 3C:
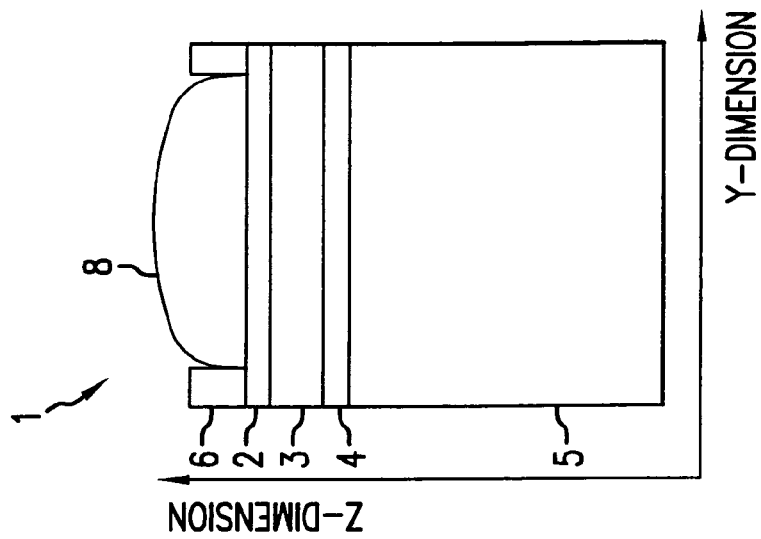
FIG. 3C is a cross-sectional side view of the portion of the printed circuit board and trace of FIGS. 3A and 3B showing the y- and z-dimensions in the x-, y-, z-coordinate system.
Figure 3B:
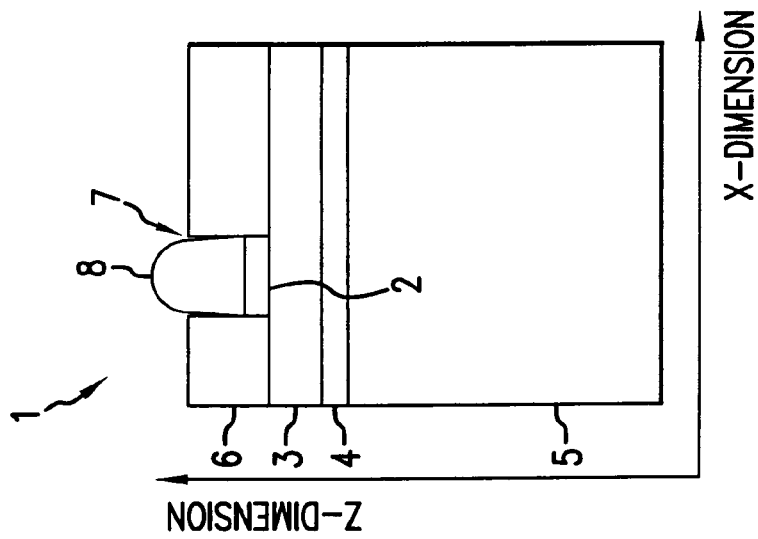
FIG. 3B is a cross-sectional side view showing the x- and z-dimensions in the x-, y-, z-coordinate system of the portion of the printed circuit board and trace of FIG. 3A.
Figure 3A:
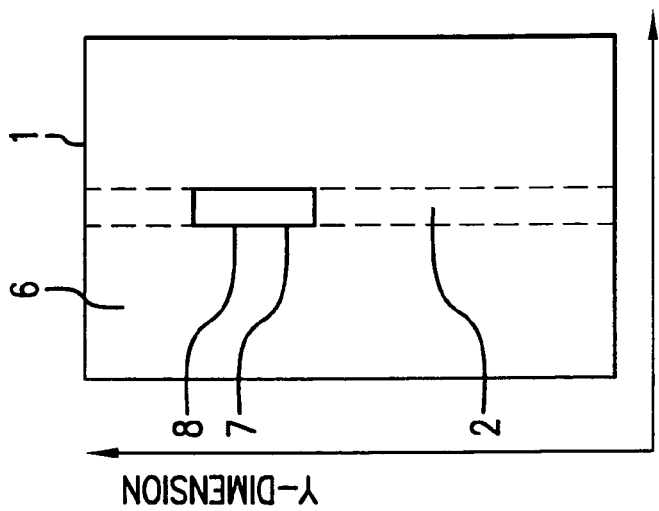
FIG. 3A is a top view of a portion of a printed circuit board showing the x- and y-dimensions in the x-, y-, z-coordinate system of a trace with a test access point structure implemented in accordance with the principles of the invention.

FIGS. 3A-3C illustrate an exemplary embodiment of a test access point structure implemented in accordance with the invention. As shown in FIGS. 3A-3C, a printed circuit board 1 includes a substrate 5, a ground plane 4, and at least one dielectric layer 3 with a trace 2 printed, deposited, or otherwise attached thereon. A solder mask 6 with a hole 7 formed over the trace 2 at a location where a test access point structure 8 is positioned is layered over the exposed surfaces of the dielectric layer 3 and trace layer 2. A test access point structure 8 is conductively attached to the trace 2 within the solder mask hole 7 at the test access point. The test access point structure 8 projects above the exposed surrounding surfaces of the solder mask 6 to form an exposed localized high point on the trace 2 that may be used as a test target by a fixture probe during testing of the printed circuit board 1. In one embodiment, the test access point structure 8 is a solder bead with a length (in the y-dimension) larger than the width (in the x-dimension) of the trace to provide maximum probe access success.

In one exemplary method of manufacture of the test access point structures 8, the invention may utilize existing printed circuit board fabrication processes, thereby keeping costs low. As known in the art, virtually every printed circuit board is constructed with high-speed signals appearing on the outer layers due to the ability to more easily control impedances on the outer layers. The two outer layers are also typically coated with a solder mask that is used to assure that only exposed copper (or other conductive materials) areas will retain solder paste that is applied via a screen printing process. Holes in the solder mask assure that only those areas of copper that should be soldered will receive solder paste.

Figure 1:
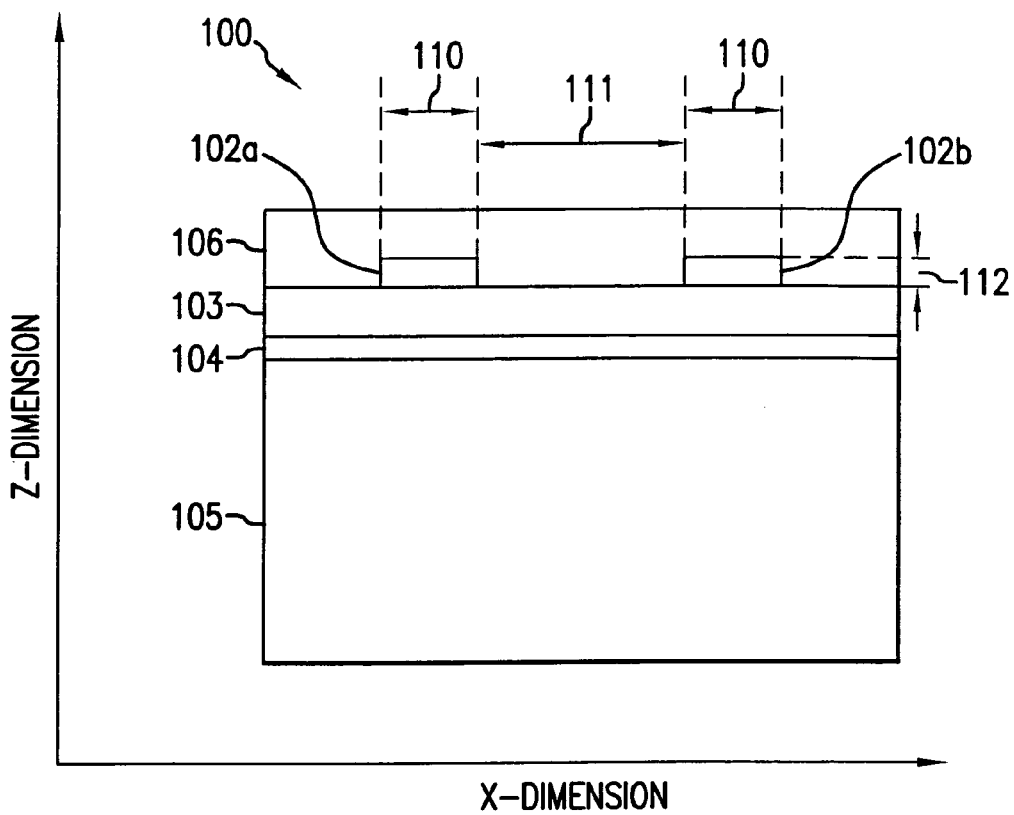
FIG. 1 is a cross-sectional side view of a conventional printed circuit board with differential signal traces showing the x- and z-dimensions in the x-, y-, z-coordinate system.
Figure 2A:
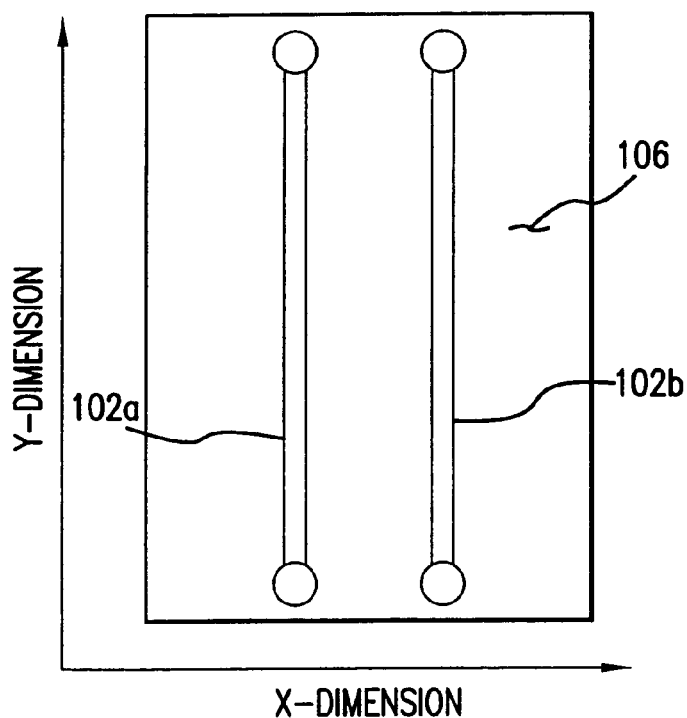
FIG. 2A is a top view of the printed circuit board of FIG. 1 showing the x- and y-dimensions of the differential signal traces in the x-, y-, z-coordinate system.
Figure 2B:
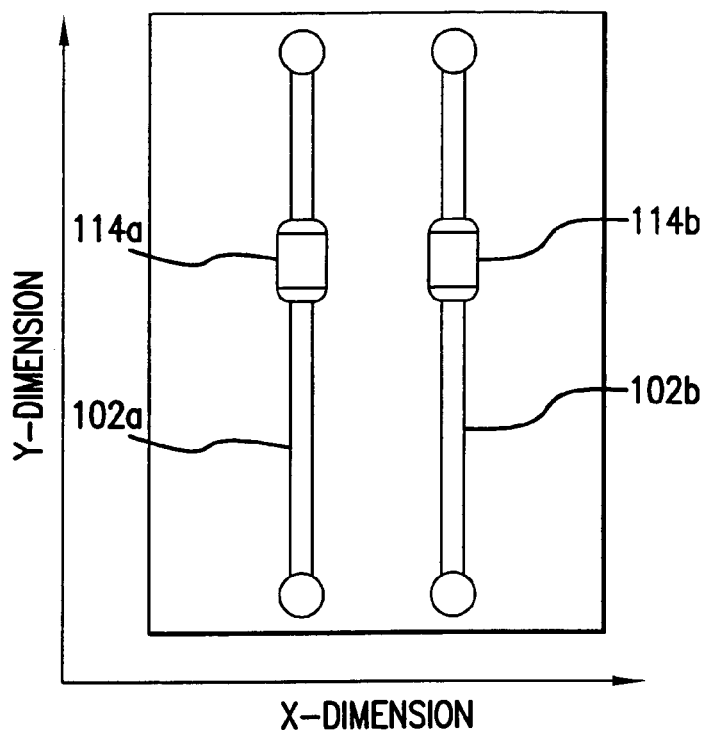
FIG. 2B is a top view of a printed circuit board showing the x- and y-dimensions in the x-, y-, z-coordinate system of a pair of differential signal traces with capacitors.
Figure 5A:
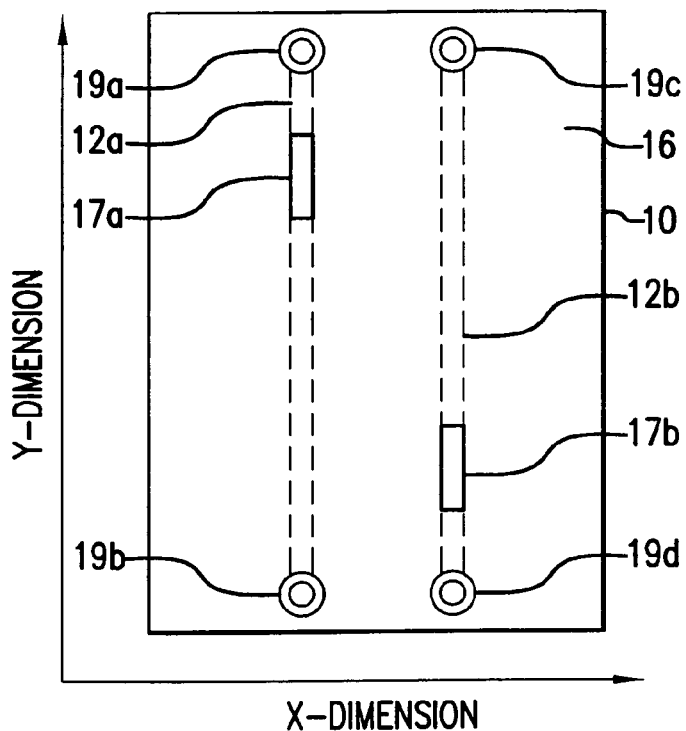
FIG. 5A is a top view of a portion of a printed circuit board showing the x- and y-dimensions in the x-, y-, z-coordinate system of a pair of differential traces with test access point structures implemented according to the method of FIG. 4.
Figure 2C:
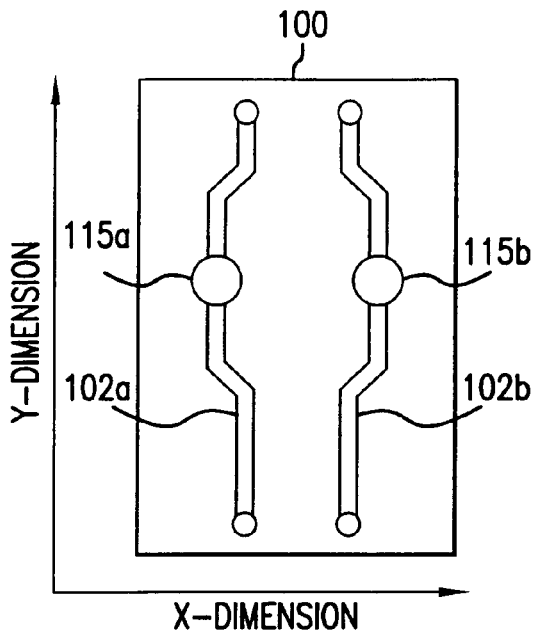
FIG. 2C is a top view of a printed circuit board showing the x- and y-dimensions in the x-, y-, z-coordinate system of a pair of differential signal traces with symmetrically arranged test access point pads.
Figure 2D:
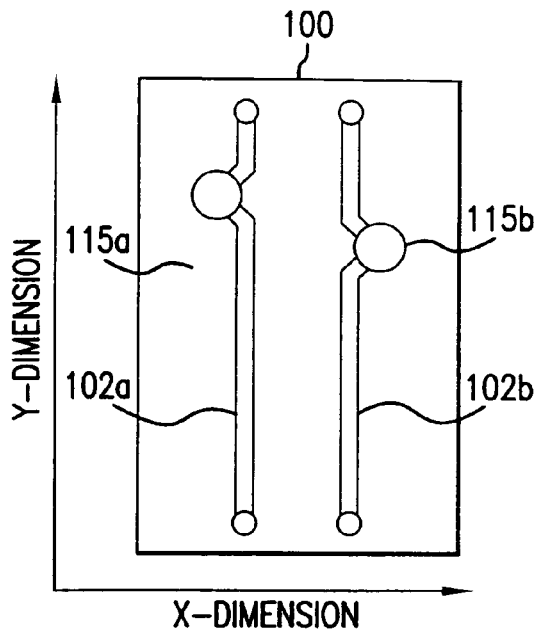
FIG. 2D is a top view of a printed circuit board showing the x- and y-dimensions in the x-, y-, z-coordinate system of a pair of differential signal traces with asymmetrically arranged test access point pads.
Figure 2E:
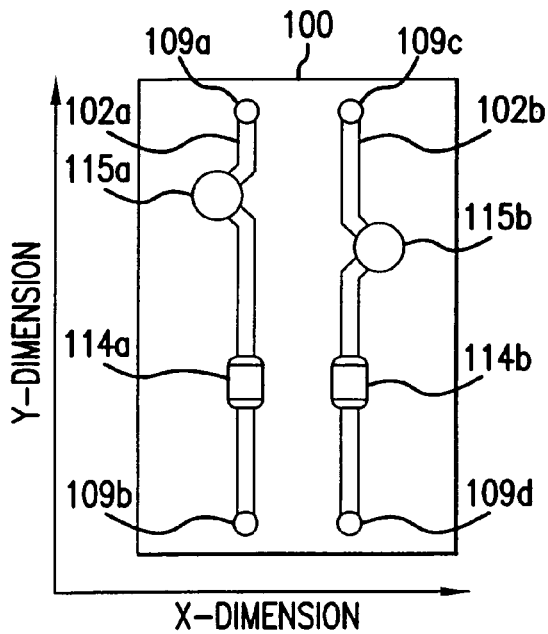
FIG. 2E is a top view of a printed circuit board showing the x- and y-dimensions in the x-, y-, z-coordinate system of a pair of differential signal traces with capacitors with asymmetrically arranged test access point pads.
Figure 2F:
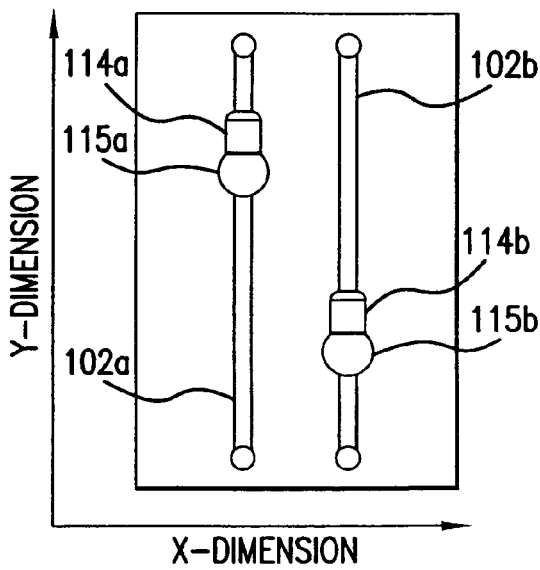
FIG. 2F is a top view of a printed circuit board showing the x- and y-dimensions in the x-, y-, z-coordinate system of a pair of differential signal traces with capacitors having test access point pads integral to the capacitors.
Figure 4:
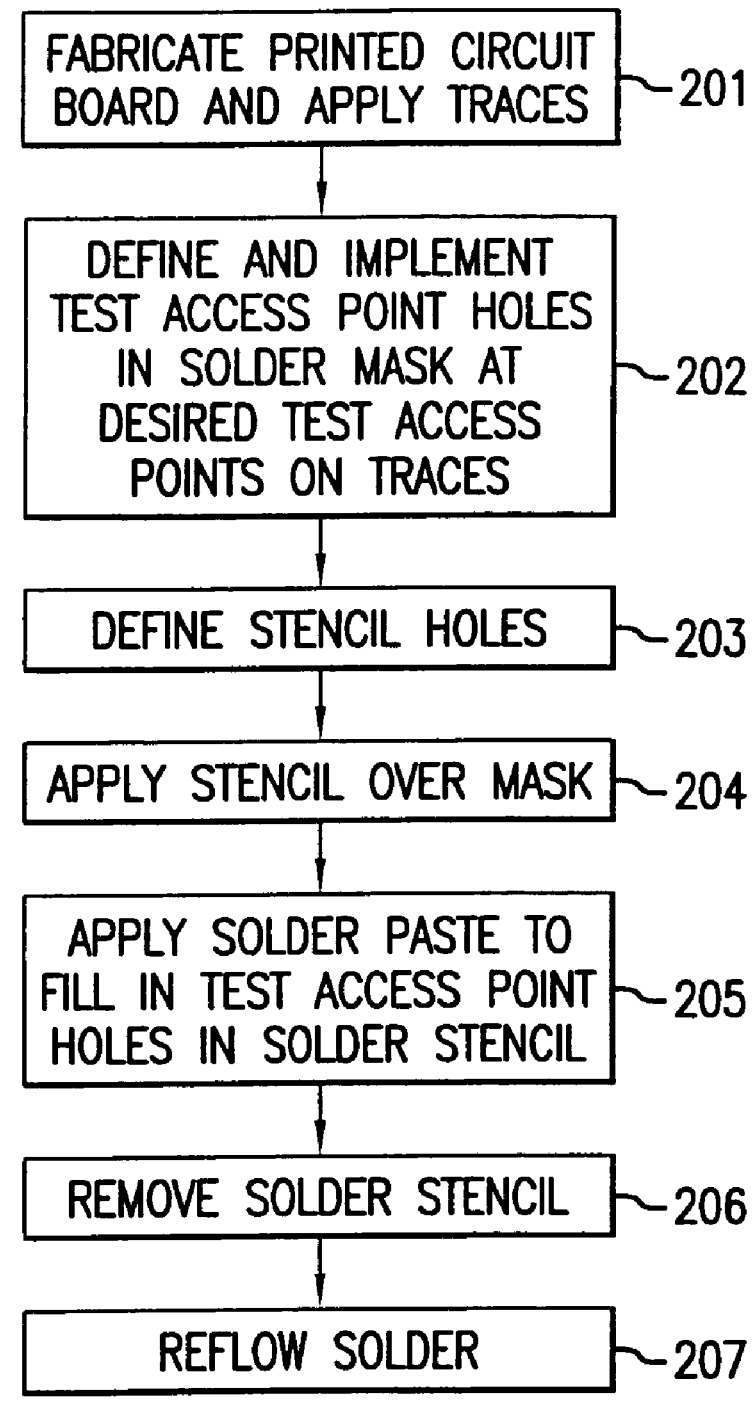
FIG. 4 is an operational flowchart illustrating a preferred method of manufacture of a test access point structure of the invention on a trace of a printed circuit board.
Figure 5B:
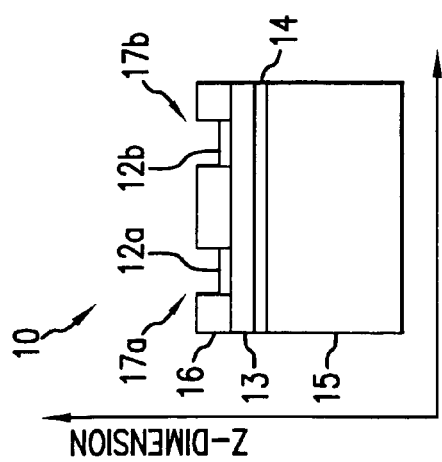
FIG. 5B is a cross-sectional side view showing the x- and z-dimensions in the x-, y-, z-coordinate system of the portion of the printed circuit board and trace of FIG. 5A after application of the solder mask but prior to application of solder paste.
Figure 5C:
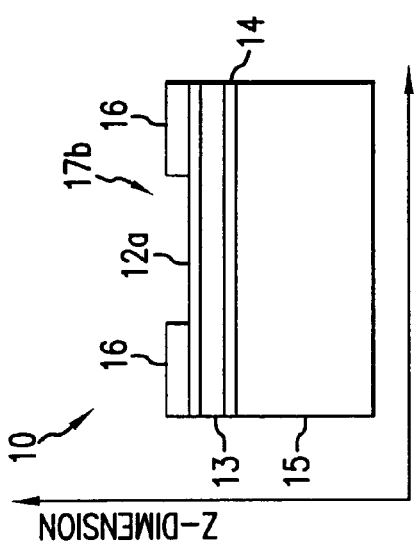
FIG. 5C is a cross-sectional side view showing the y- and z-dimensions in the x-, y-, z-coordinate system of the portion of the printed circuit board and trace of FIGS. 5A and 5B after application of the solder mask but prior to application of solder paste.

FIG. 4 is an operational flowchart illustrating a preferred method 200 of manufacture of a test access point structure on a trace of a printed circuit board, and FIGS. 5A-5G include various views of a portion of a printed circuit board 10 during manufacture of the test access point structure 18a, 18b in accordance with the method of FIG. 4. Referring now to FIG. 4 with additional reference to FIGS. 5A-5G, in the preferred method of manufacture of the test access point structures of the invention, the printed circuit board 10 is fabricated in step 201 to the point of printing, depositing, or otherwise layering the traces 12a, 12b on which test access point structures 18a, 18b are to be implemented. In step 202, test access point holes 17a, 17b (in addition to holes 19a, 19b, 19c, 19d for the traditional points of solder—e.g., component pin-to-trace solder points) are defined and implemented in the printed circuit board solder mask 16 in locations over traces 12a, 12b at desired test access points, as illustrated in FIGS. 5A, 5B, and 5C.

Figure 8A:
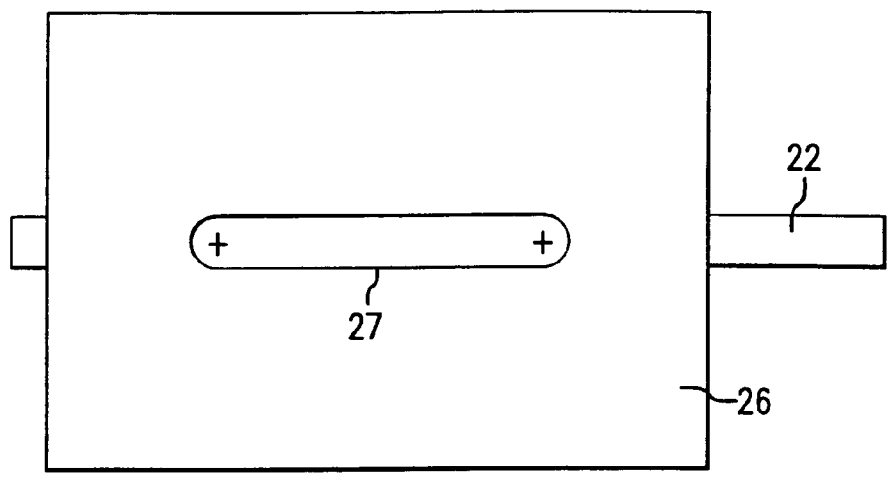
FIG. 8A is a top view of a portion of a printed circuit board showing a solder mask over a trace according to a method of the invention.
Figure 8B:
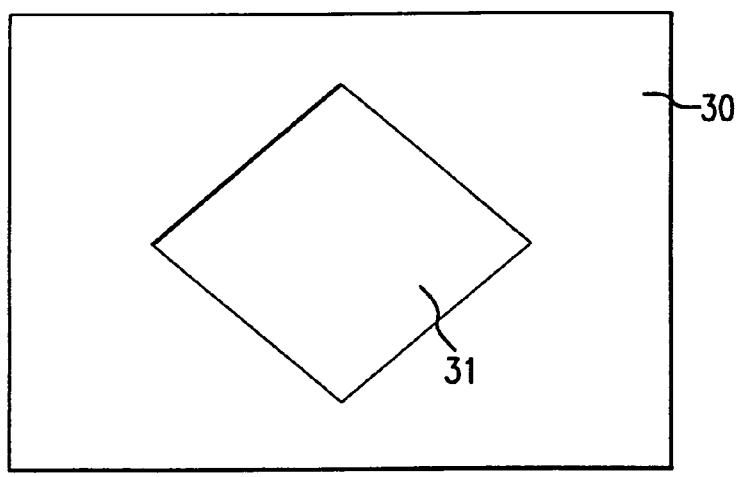
FIG. 8B is a top view of a portion of a solder stencil mask in accordance with a method of the invention.

The positions of the test access point holes 17a, 17b in the solder mask 16 are governed by rules on minimum probe spacing and proximity to other devices that must be avoided. In step 203, holes are defined in a solder stencil (shown in FIG. 8B) and in step 204 the solder stencil is applied over the mask 16 (shown in FIG. 8C), such that the holes in the solder stencil are aligned over the test access point holes 17a, 17b in the solder mask 16 along a diagonal in the solder stencil.

Figure 5D:
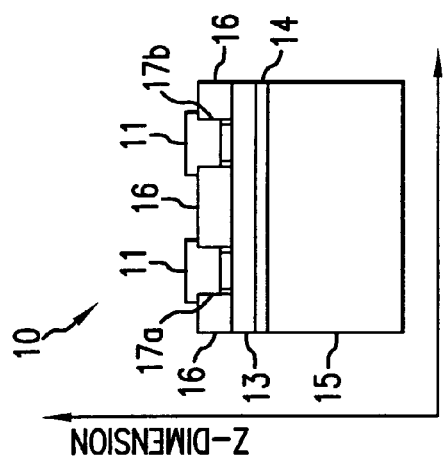
FIG. 5D is a cross-sectional side view showing the x- and z-dimensions in the x-, y-, z-coordinate system of the portion of the printed circuit board and trace of FIGS. 5A-5C after application of solder paste.
Figure 5E:
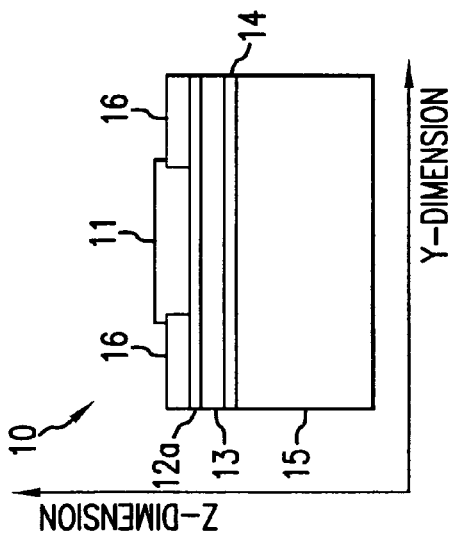
FIG. 5E is a cross-sectional side view showing the y- and z-dimensions in the x-, y-, z-coordinate system of the portion of the printed circuit board and trace of FIGS. 5A-5D after application of solder paste.

Once the test access point holes 17a, 17b are located and the solder mask 16 is produced, printed circuit board fabrication proceeds as is normal in the art. To this end, in step 205, solder paste 11 is applied to the board 10, thereby filling the solder mask holes 17a, 17b, using the standard well-known silk-screen process, as illustrated in hole 17a in FIGS. 5D and 5E. The area of the hole (31 in FIG. 8b) and the thickness of the solder stencil determines the volume of solder paste 11 that ends up in the hole 17a. It should be noted that the solder mask hole may not be completely filled when the solder paste is deposited, but any voids are filled during the reflow step. In step 206, the solder stencil is removed leaving bricks or islands 11 of solder paste, as shown in FIGS. 5D and 5E.

Figure 5F:
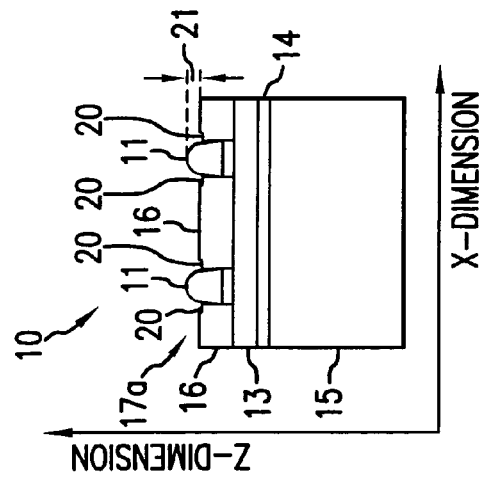
FIG. 5F is a cross-sectional side view showing the x- and z-dimensions in the x-, y-, z-coordinate system of the portion of the printed circuit board and trace of FIGS. 5A-5E after soldering.
Figure 5G:
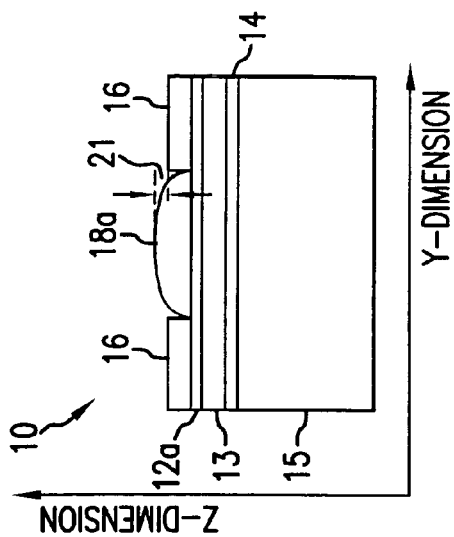
FIG. 5G is a cross-sectional side view showing the y- and z-dimensions in the x-, y-, z-coordinate system of the portion of the printed circuit board and trace of FIGS. 5A-5F after soldering.

In step 207, the solder paste is soldered to the conductive areas exposed by the solder mask, for example using a reflow soldering technique. Soldering is a very well understood process. As known in the art, the solder paste is approximately 50% metal and 50% flux by volume. When the solder paste melts during reflow soldering, the flux burns off, preventing oxidation of the solder and reducing the end volume. Surface tension causes the paste to reform from a rectilinear shape, as defined by the mask hole, into a semi-ellipsoidal shape defined by the exposed copper. Thus, the melted solder will retract from the walls 20 of the test access point hole 17a in the solder mask 16 and form a bead 18, as illustrated in FIGS. 5F and 5G that can project some distance 21 above the solder mask 16. This distance, or test access point structure thickness 21 in the z-dimension of the x-, y-, z-coordinate system, is determined by the area of the exposed trace 12a, 12b and the original volume of the solder paste 11.

Figure 6A:
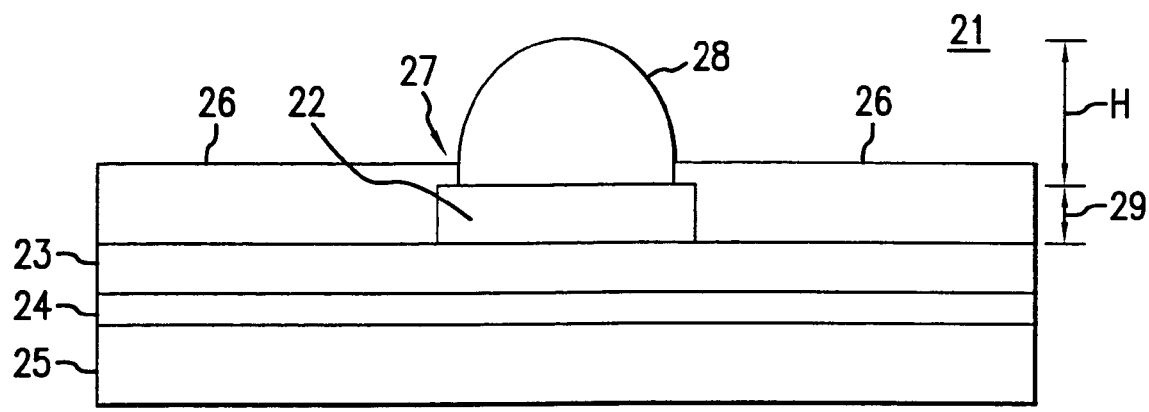
FIG. 6A is a cross-sectional, side view of a portion of a printed circuit board showing a trace within a test access point structure implemented in accordance with the principles of the invention.

An important factor to probing a bead probe or test access point is its electrical contact resistance with the fixture probe is contacting it. Bead probes may have or develop surface contaminates, residues or oxides on the outer surface that may degrade or raise the contact impedance. One exemplary method to overcome this contact impedance problem due to surface residues, is to deform the bead probe with the fixture probe. FIG. 6A illustrates a substrate 25, such as FR4 board substrate, ground plane 24, dielectric 23, trace 22, solder mask 26 with a hole 27 formed over the trace 22 at a location where a test access point structure or bead probe 28 is layered over the exposed surface of the trace 22. As shown in FIG. 6A, test access point 28 has a relatively rounded upper surface after solder reflow.

Figure 6B:
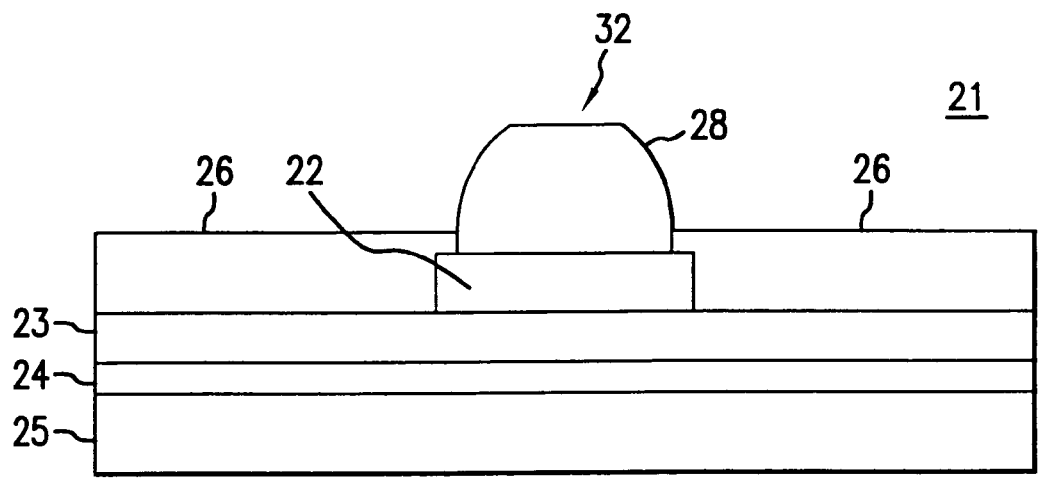
FIG. 6B is a cross-sectional side view showing the portion of printed circuit board of FIG. 6A after coming into compressive contact with a fixture probe.
Figure 7:
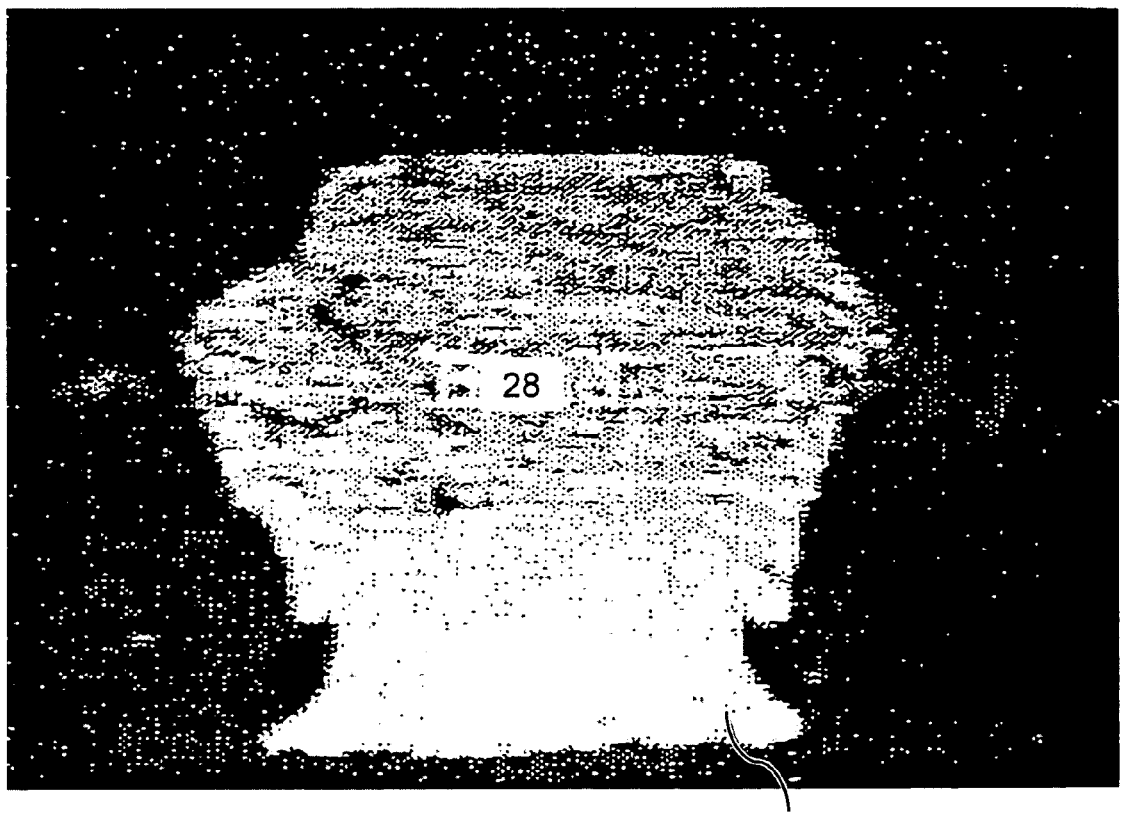
FIG. 7 is a blown-up, cross-sectional microphotograph of a test access point structure on a trace of a printed circuit board in accordance with the invention.

FIG. 6B illustrates the same test access point 28 with a deformed upper surface 32 after a fixture probe (not shown) has contacted test access point 28 with a predetermined amount of force. For the purposes of discussion, assume the fixture probe has a flat surface that comes in contact with the test access point or bead 28. If the radius of curvature is tight enough, the test access point structure 28 made of solder is subject to deformation when a fixture probe contacts it with a predetermined amount of force. A typical fixture probe force is approximately 4-8 ounces. The yield strength of typical solders (both leaded and lead-free) is approximately 5000 psi. Thus, when a fixture probe compressively contacts a newly formed bead or test access point 28 for the first time, the test access point 28 will deform with a substantially flattened top, as shown in FIG. 6B. The flat area 32 grows as the solder deforms, until the flat area 32 is great enough to support the fixture probe force. The process of deforming the bead or test access point 28 displaces any surface oxides, contaminants or residues and gives the fixture probe excellent electrical contact to the solder of the test access point 28. FIG. 7 illustrates a blown-up, cross sectional microphotograph of an actual test access point 28 over a trace 22 after the test access point 28 has been deformed by a fixture probe to have a flat upper surface 32.

By way of analogy, one can think of a potato as a bead probe and the potato skin as surface contaminates, residues or oxides. The potato is placed on a flat, hard surface. A second object, representing a fixture probe, having a flat, hard surface with a diameter at least as large as that of the potato is brought into compressive contact with the potato until the surface of the potato begins to deform and flatten. As this happens, the potato skin will be deformed and the flat surface of the second object, representing the fixture probe will come into contact with the inside of the potato, representing uncontaminated solder of the bead probe.

As an exemplary model, the yield strength of solder is approximately 5000 psi or 0.005 pounds per square mil, or 0.08 ounces per square mil. Thus, to support a typical 4 ounce flat probe, the flattened area 32 of the test access point 28 must be 4/0.08 or 50 square mils. Assume a 5 mil wide by 20 mil long bead 28 that is approximately 3 mils high. Assume that when the fixture probe first touches the bead 28, there is no flattened surface area. Then as the fixture probe pushes down on the solder, the area that is flattened 32 approximates an ellipse with a 1:4 width/length ratio. As this area increases, the solder yield begins to slow until there is a "footprint" of 50 square mils, or about ½ the total area of the bead itself. Once the surface area is large enough to support the fixture probe force, no further deformation occurs. Subsequent probing does not produce any further deformation.

A bead 28 that is too small will flatten until the point where the deformation is catastrophic, causing the bead to "mushroom" out and flatten onto the solder mask. Parts of it may break off as a result. If on the other hand, a bead 28 is too big, the amount of deformation will be small and the surface contaminants may not be displaced enough to give good electrical contact. Thus, the size of the bead 28 with respect to the expected probing force is an important design parameter. The inventor's have determined that the amount of deformation suggested in the above example and the manufacturing method described below give excellent results for test access point (bead) 28 longevity and contact resistance.

A method of manufacturing bead probes will be discussed with reference to FIGS. 8A-8C, 9A-9B and 10. In an exemplary method of manufacture of the test access point 28 of the invention, a printed circuit board with traces is fabricated according to traditional fabrication method in step 71. Desired testing location(s) along trace(s) on a printed circuit board are determined and implemented as obround test access point holes in step 72. A test access point should be located a predetermined minimum distance away from other test access points and devices mounted on the printed circuit board with a predetermined safety margin to ensure that the fixture probe used to contact the test access point 28 does not interfere with other test access points, fixture probes contacting other test access points or other devices mounted on the printed circuit board. The distance between test access points is largely determined by the size of the fixture probe used to contact the various test access points on the printed circuit board.

Figure 9A:
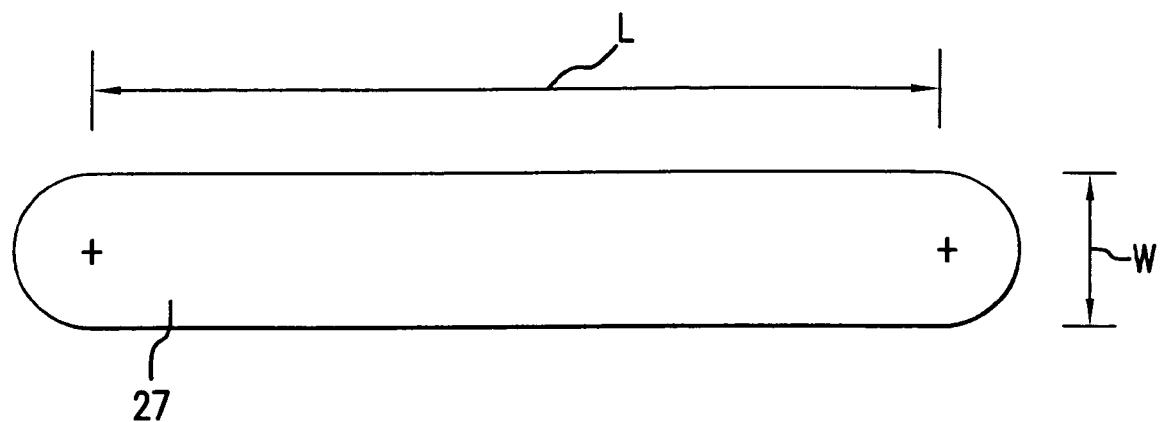
FIG. 9A is a top view showing the obround hole in the solder mask of FIGS. 8A-8C.

As discussed above, in step 72, obround (a rectangle with rounded ends) hole(s) 27 are formed (by means of standard photo-optical processing) in solder mask 26 over the trace 22 on the printed circuit board (not shown). The obround hole 27 may have a width W and length L, where L is measured from the center of the two circular ends, as shown in FIG. 9A. The obround hole 27 may have a total length of L+W and should be substantially the same width as the trace 22 directly underneath it. The length of the obround hole may preferably run along the trace. If the trace is wider than 3-5 mils, the obround hole may be narrower than the trace to prevent the solder bead from being too large.

Figure 8C:
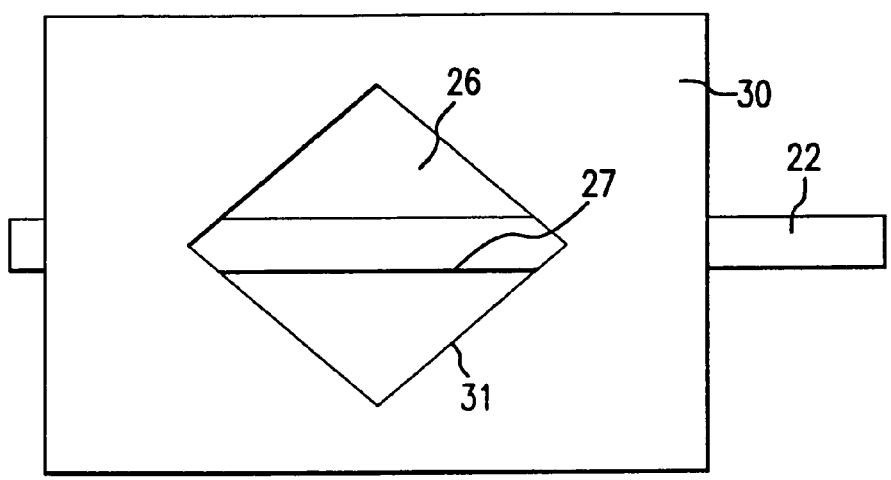
FIG. 8C is a top view of a portion of a printed circuit board showing a solder stencil mask over laying a solder mask over laying a trace on a printed circuit board in accordance with the invention.
Figure 9B:
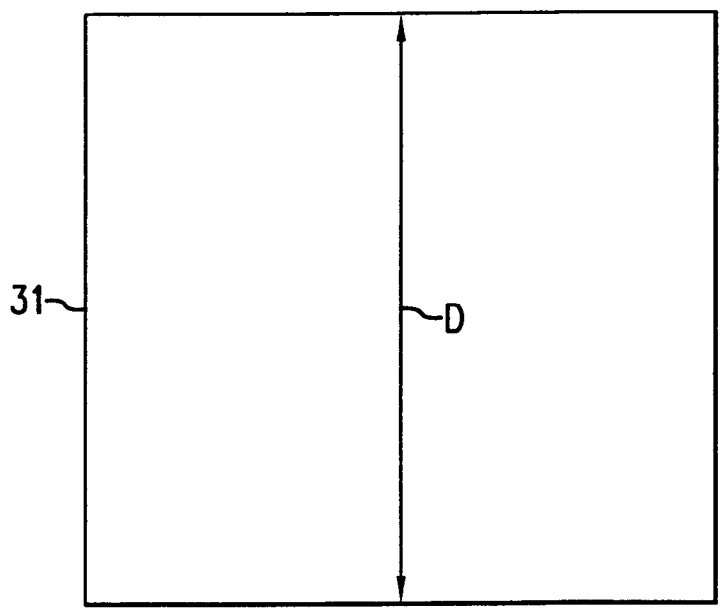
FIG. 9B is a top view showing the square hole in the solder stencil hole of FIGS. 8B-8C.
Figure 10:
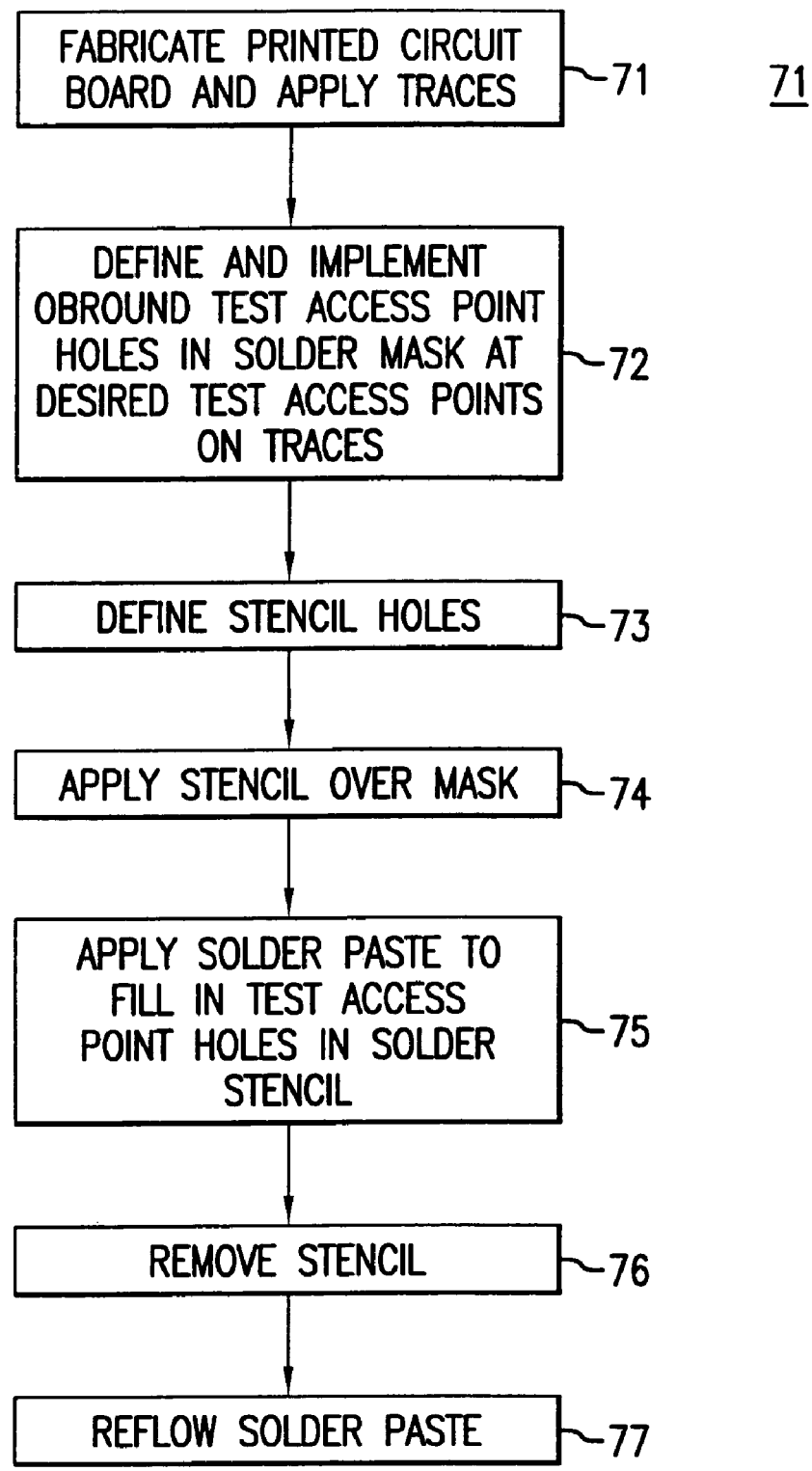
FIG. 10 is an operational flow chart illustrating a method of manufacture of a test access point structure on a trace of a printed circuit board in accordance with the invention.

In step 73, a substantially square hole 31 is formed in a solder stencil mask 30 by means of standard photo-optical, etching or laser drilling processes. A side of the square hole 31 may have a length D, as shown in FIG. 9B. In step 74, the solder stencil 30 is applied to the solder mask 26 with the diagonal of the square hole 31 of the solder stencil 30 centered on the centerline of the obround hole 27 in the solder mask 26, as shown in FIG. 8C. While other configurations and alignments are possible, this layout maximizes the amount of solder paste that will end up being in direct contact with the signal trace 22. In step 75, solder paste is deposited by standard paste screening processes over the solder stencil 30. Some solder paste may be applied to the solder mask 26 on either side of the signal trace 22. In step 76, the solder stencil 30 is removed from the solder mask 26. In step 77, the solder is reflowed by standard soldering reflow methods. The centering of the diagonal of the square hole 31 maximizes the area of the trace 22 that is covered with solder paste, while reducing the potential "travel" that the molten solder will have to run to completely cover the trace 22 during the reflow process.

When the solder is reflowed, it will spread out on the trace 22 due to its affinity for copper or other conductive material and it will exit the solder mask 26 due to its lack of affinity for the mask material. Thus, the molten solder will bead up on the exposed copper or other conductive material trace 22. The square pattern of the solder pates will allow solder past to more reliably stick to the board during stenciling, and not peel up when the solder stencil 30 is removed from the board. Length D should preferably not be smaller than the value that can reliably deposit solder on the board.

The dimensions of the solder mask and stencil mask holes can be used to calculate the bead 28 height and length. The height of the resulting bead 28 may be determined by the area of the solder mask obround hole 27 and the volume of the solder paste applied to the board or the pre-reflow solder paste. The area of the obround hole 27 in the solder mask 26 is: Area=$W*L+\pi*(W/2)^2$. The pre-reflow solder paste volume is the area of the solder stencil hole 31 multiplied by the stencil thickness T. That is the pre-reflow solder paste volume=$T*D^2$. Since solder paste, by volume, is approximately 50% flux, about 50% of the paste volume will be left as a solder bead 28 after the reflow process step. That is, the post-reflow solder bead 28 volume=$T*D^2/2$. The height H of the bead 28 may be such that the resultant bead 28, standing on the underlying signal trace 22, will protrude above the solder mask 26 by 2 to 3 thousandths of an inch. The height H of bead 28 is approximately the post-reflow solder volume divided by the solder mask opening area or:

$$H=(T*D^2/2)/(W*L+\pi*(W/2)^2)$$

Given stencil thickness T, stencil hole diameter D, solder mask opening width W, and bead height H, than bead length L is approximately:

$$L=((T*D^2/2)/(H*W))-\pi*W/4$$

Figure 11:
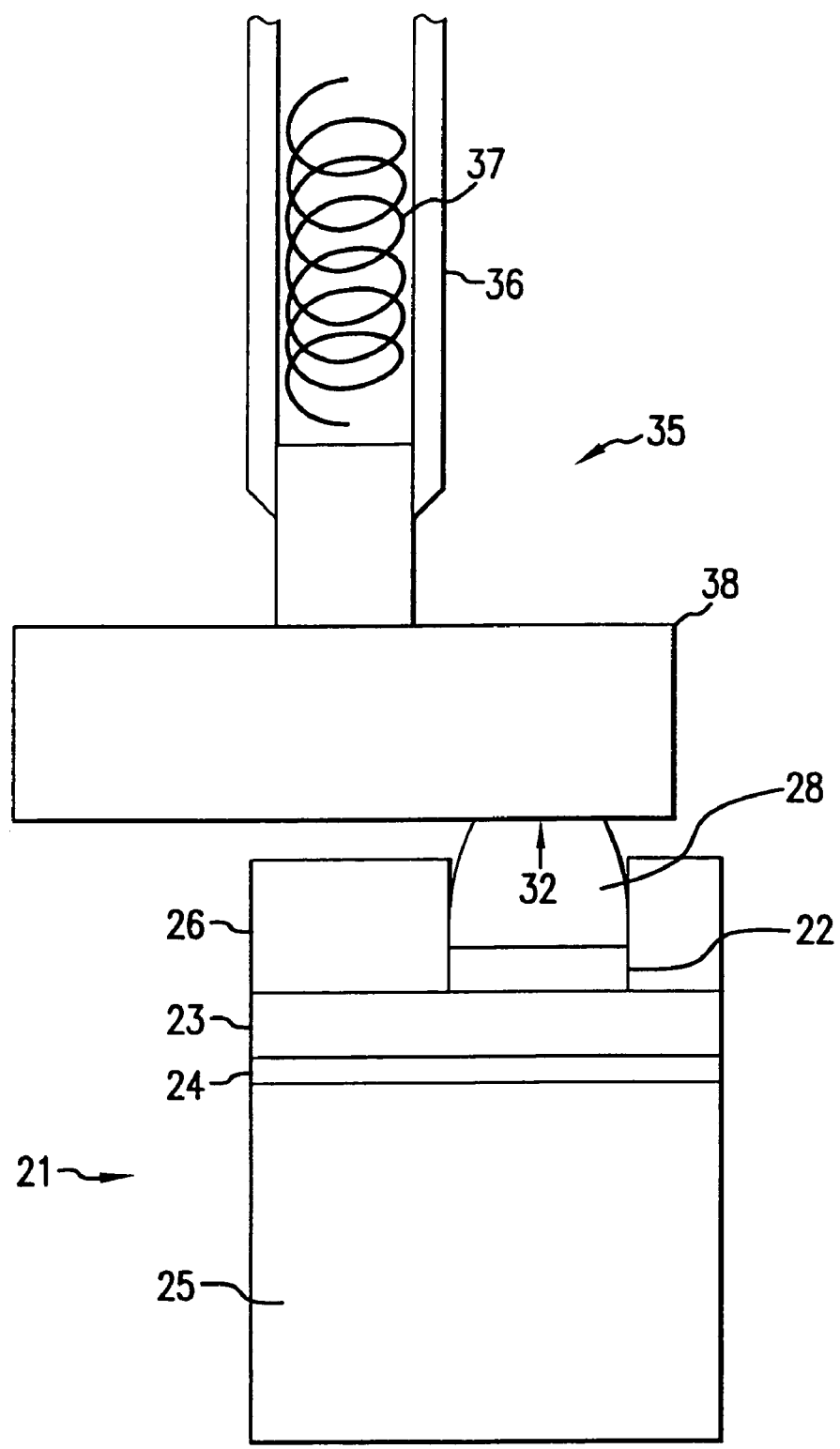
FIG. 11 is a side cross-sectional side view showing a portion of a printed circuit board with a test access point structure on a trace of a printed circuit board and a fixture probe contacting the test access point structure in accordance with the invention.
Figure 12:
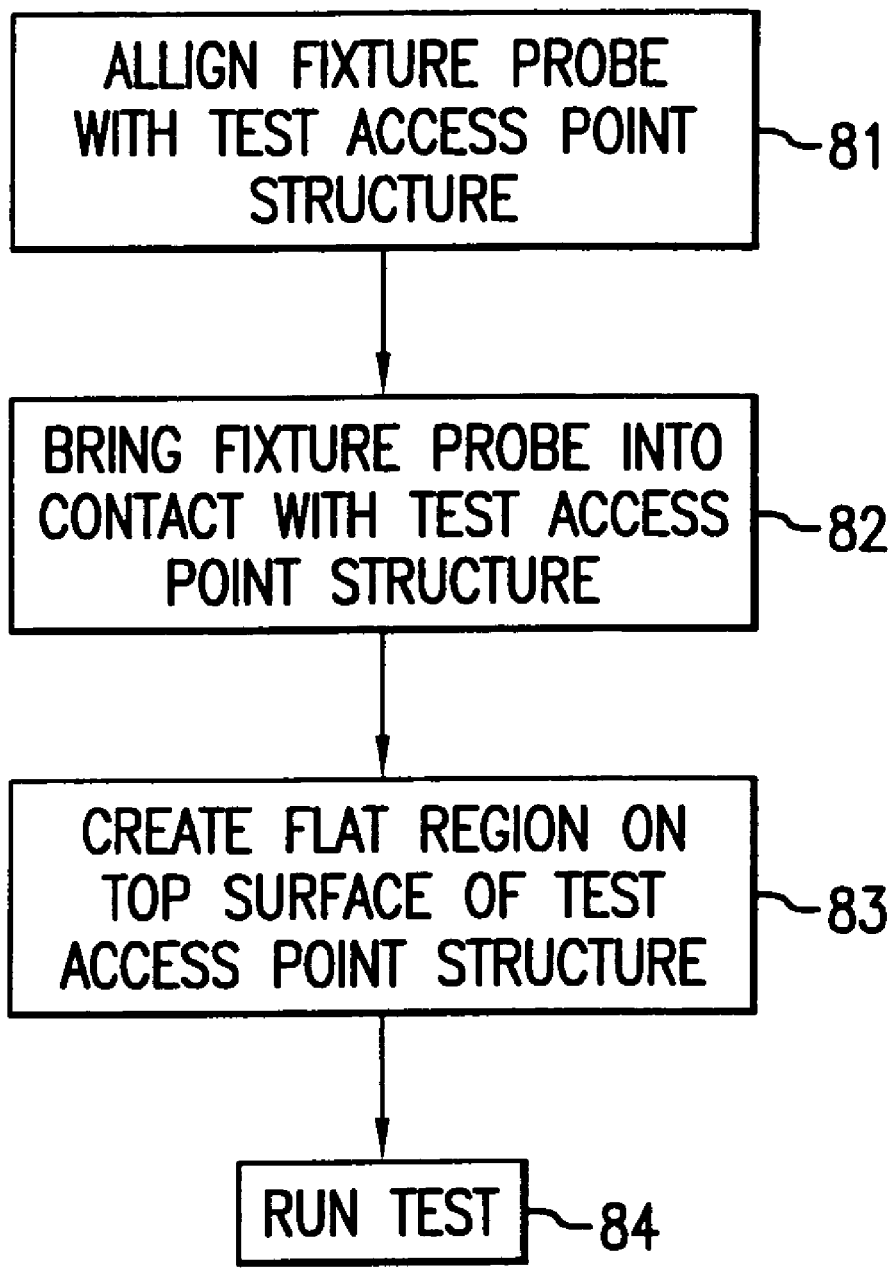
FIG. 12 is an operational flow chart illustrating a method of testing a test access point structure on a trace of a printed circuit board in accordance with the invention.

FIG. 11 illustrates a side cross-sectional view of a fixture probe contacting a test point access structure in accordance with the invention. As shown in FIG. 11, a printed circuit board 21 comprises a substrate 25, a ground plane 24, and at least one dielectric layer 23 with at least one trace 22 printed, deposited or otherwise attached thereon. A solder mask 26 with a hole formed over the trace 22 at a location where a test access point structure 28 is positioned over the exposed surfaces of the dielectric layer 23 and trace layer 22. Test access point structure 28 is conductively attached to trace 22 within the solder mask hole 27 at the test access point. The test access point structure 28 projects above the exposed surrounding surfaces of the solder mask 26 to form an exposed localized high point on the trace 22 that may be electrically contacted as a test target by a fixture probe 35 during testing of the printed circuit board 21.

As discussed above and shown in FIG. 11, as the fixture probe 35 is brought into initial compressive contact with test access point structure 28, test access point structure will be deformed and form a substantially flat upper surface 32, which will move any potential surface oxide, residues or contaminates and permit a good electrical contact between the fixture probe 35 and the test access point structure 28. The compressive force between the fixture probe and the test access point structure 28 may be from any known means, such as a spring loaded fixture probe 35 with a shaft 36, a spring force mechanism 37 and a substantially flat contact area 38. Such probes are available from fixture probe manufacturers, such as Interconnect Devices, Inc. of Kansas City, Kans.

Current trace widths are typically 3-5 mils wide, but may be as wide as 20 mils wide. Test access point structures or bead probe structures 28 may be approximately 3-5 mils wide by 15-20 mils long and may project 1-3 mils above the exposed surface of the printed circuit board.

Fixture probe 35 may be any known fixture probe with a substantially flat or smooth surface, such as a standard 35 mil round head/flat-faced plated fixture probe. Current design for test guidelines for ICT (in circuit testers) require a minimum 30 mil diameter testpad probed by a chisel or spear tipped probe. State of the art ICT fixtures can reliably probe down to 23 mil diameter targets. Thus, the small test access point structures or bead structures 28 may be probed with any industry standard probes with approximately 23-35 mil diameter flat head.

Another important consideration is the co-planarity of the printed circuit board surface and the face of the flat fixture probe. The face of the fixture probe may not be parallel to the printed circuit board prior to making contact with the bead 28. If the angle is too steep, the edge of the fixture probe may strike the printed circuit board prior to making contact with the bead 28 resulting in poor contact or no contact. A typical printed circuit board flexes slightly as the fixture probes in the fixture exert pressure on the printed circuit board. Fixtures are typically very carefully designed to keep this flex within specifications to guarantee that all probes compress to between $1/3$ and $2/3$ of their total travel for reliable contact with test points on the printed circuit board. Standard ICT probe travel is approximately 250 mils, so a fixture is designed to make sure that all probes are compressed between 80 and 160 mils.

For example, assume a 16 by 22 inch printed circuit board, and take the shortest dimension of 16 inches, the co-planarity of a typical fixture must be better than (160−80)/16,000 or 0.005 or 0.5%. With a co-planarity of 0.5%, assume a 35 mil diameter flat fixture probe 35 and a 1 mil high bead 28. Now assuming a worst case scenario of the bead 28 at the very edge of the fixture probe gives a co-planarity of $1/35$ or 2.8%. Thus, there should not be a problem with the co-planarity and flexing in most fixtures available today.

While a waffle or other patterned surface fixture probe is possible to use, a flat surfaced fixture probe is considered better, as the aforementioned surface deformation provides excellent electrical contact results and overcomes certain drawbacks of a waffle surfaced fixture probe. For example, a substantially flat surfaced fixture probe will not dig into the surface and should therefore not damage the bead 28 on successive probing. Also, a waffle-patterned surface fixture probe will collect contaminants more easily and at the same time will be harder to clean. Also, the sharp points of a waffle patterned fixture probe may wear out as many boards are tested. A relatively smooth or flat surfaced avoids these drawbacks of a waffle or patterned surface fixture probe.

It will be appreciated from the above detailed description of the invention that the present invention uniquely solves the conflict problems faced by traditional techniques for test access point placement on printed circuit boards. In particular, in the prior art paradigm, test access points are treated as "targets" on a printed circuit board that are hit by probes. In the new paradigm as presented herein, the probes are integrated into the printed circuit board itself using solder beads or increased trace thickness, and the fixture probes are treated as the targets. Since in the invention the perturbations of traces in the x- and y-dimensions are minimized, and the z-dimension of the trace is utilized to implement test access points, test access points may be placed almost anywhere along the trace. This allows the placement decision of the test access points on the board to be made according to the locations of the fixture probes of a given test fixture rather than vice versa as done in the prior art.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, the test access targets may be deformed by some means other than by contact with the fixture probes. It is also possible that other benefits or uses of the currently disclosed invention will become apparent over time.

What is claimed is:

1. An assembly, comprising:
 a trace on a dielectric;
 a solder mask characterized by a solder mask thickness and layered over said trace, said solder mask having a hole exposing a portion of said trace at a test access point location;
 a solder bead soldered to said exposed portion of said trace in said hole of said solder mask, said solder bead projecting through said hole and having a solder bead thickness greater than said solder mask thickness, and
 a fixture probe in contact with said solder bead.

2. An assembly in accordance with claim 1, wherein:
 said fixture probe is substantially flat.

3. An assembly in accordance with claim 1, wherein said fixture probe compressively contacts said solder bead and deforms an upper surface thereof.

4. An assembly, comprising:
 a trace printed along an x-y plane in an x-, y-, z-coordinate system of a dielectric, said trace generally characterized by a trace thickness along a z axis perpendicular to an x-y plane of said dielectric;
 a solder mask layered over said trace;
 a test access point structure conductively connected to said trace at a test access point, said test access point structure including a solder bead having a thickness greater than the solder mask thickness;
 wherein said test access point structure projecting projects along a z axis in an x-, y-, z-coordinate system above an exposed surface of said solder mask on said printed circuit board to be accessible for electrical probing by an external device;

and a substantially smooth external device in compressive contact with said test access point structure.

5. An assembly in accordance with claim 4, wherein said substantially smooth external device deforms an upper surface of said solder bead of said test access point structure from substantially round to substantially flat.

6. An assembly in accordance with claim 4, wherein said substantially smooth external device deforms any contaminants on an upper surface of said solder bead of said test access point structure, and forms an electrical contact with said solder bead of said test access point structure.

7. An assembly in accordance with claim 4, wherein said solder mask has an obround hole exposing said solder bead of said test access point structure.

8. An assembly in accordance with claim 7, wherein said test access point structure comprises an oblong solder bead/bump running along an upper surface of said trace.

* * * * *